United States Patent [19]

Cornish

[11] 4,266,208
[45] May 5, 1981

[54] BROADBAND MICROWAVE FREQUENCY DIVIDER FOR DIVISION BY NUMBERS GREATER THAN TWO

[75] Inventor: William D. Cornish, Ottawa, Canada

[73] Assignee: Her Majesty the Queen in right of Canada, as represented by the Minister of National Defense, Canada

[21] Appl. No.: 30,386

[22] Filed: Apr. 16, 1979

[30] Foreign Application Priority Data

Aug. 31, 1978 [CA] Canada .................................. 310453

[51] Int. Cl.³ .............................................. H01P 1/20
[52] U.S. Cl. .................................... 333/218; 333/223
[58] Field of Search ......................... 333/218; 363/158

[56] References Cited

U.S. PATENT DOCUMENTS 4,152,680   5/1979   Harrison .......................... 363/158 X Primary Examiner—Paul L. Gensler
Attorney, Agent, or Firm—Stevens, Davis, Miller & Mosher

[57] ABSTRACT

Frequency division of microwave signals may be done using heterodyne conversion but there are limits to the ultimate instantaneous bandwidth that can be down-converted using this method and any frequency aberrations of the local oscillator show up at the output. It is also known to down-convert microwave signals by using a varactor divide-by-two system. However, to divide by factors greater than two, these dividers must be cascaded which results in losses that must be compensated by amplifiers. The present invention alleviates the foregoing problems by providing a single-stage analog microwave frequency divider which will divide microwave signals by four. The divider comprises a substrate having an input microstrip transmission line capacitively coupled to a resonator formed of first and second spaced apart parallel microstrip transmission lines of predetermined length. One end of each of these lines are joined together by a transverse microstrip transmission line and the other end of each of these lines is connected to substrate ground via an associated varactor diode. The first and second microstrip transmission lines are electromagnetically coupled to third and fourth microstrip transmission lines and the third and fourth microstrip transmission lines are connected in series to a stripline balun comprising an output of the divider.

4 Claims, 6 Drawing Figures $\theta$ = ELECTRICAL LENGTH OF TRANSMISSION LINE

BROADBAND MICROWAVE FREQUENCY DIVIDER FOR DIVISION BY NUMBERS GREATER THAN TWO

This invention relates to an analog microwave frequency divider for dividing an input microwave signal by four.

It is frequently desirable to down-convert microwave signals to a lower frequency. For example, after down-conversion, digital techniques can be adopted for measuring the frequency of the down-converted signal and, knowing the factor by which the original signal was divided, it is easy to determine the original frequency of the microwave signal.

A presently well-established technique for down-conversion of microwave signals uses heterodyne conversion which relies on mixing a signal from a local oscillator with the microwave input signal. During heterodyne conversion, the absolute bandwidth remains unchanged and the fractional bandwidth increases. For instance, an input band of $(f_2-f_1)$ with center frequency $f_0$ will retain a bandwidth of $(f_2-f_1)$ even though the center frequency has been reduced by the factor n to $f_0/n$. For a system producing a reduction by a factor "n," the heterodyning technique requires n times the fractional bandwidth at the output compared with the input. This limits the ultimate instantaneous bandwidth that can be down-converted using this method. In addition, any frequency aberrations of the local oscillator such as tuning time and post-tuning drift show up at the output.

Recently, a broadband frequency divider using microwave varactors has allowed down-conversion by a division-by-two process. Such a frequency divider is disclosed in Canadian Pat. No. 1,041,614, which issued on Oct. 31, 1978 in the name of Her Majesty the Queen in Right of Canada as represented by the Minister of National Defense and entitled "Broadband Frequency Divider Using Microwave Varactors". This same frequency divider is disclosed in U.S. Pat. No. 4,152,680. Such dividers rely on the generation of a sub-harmonic at one half the input frequency. Unlike the heterodyning technique, the varactor divide-by-two system reduces the absolute bandwidth in the division process such that the fractional bandwidth remains the same. This overcomes the bandwidth restraint inherent in the heterodyning technique. However, to divide by a factor greater than two, more than one divider must be cascaded. Because of circuit losses within the divide-by-two devices an amplifier must be placed between each divider. A divide-by-n system would require n/2 dividers and n/2 amplifiers used in cascade.

The present invention alleviates the problems of the prior art arrangements discussed above by providing a single-stage analog microwave frequency divider that will divide microwave signals by a factor of four.

Thus, in accordance with the broadest aspect of the invention, there is provided an analog microwave frequency divider for dividing an input microwave signal by four, comprising a substrate having an input microstrip transmission line capacitively coupled to a resonator formed of first and second spaced apart parallel microstrip transmission lines of predetermined length, one end of each of said first and second microstrip lines being joined together by a transverse microstrip transmission line and the other end of each of said first and second microstrip transmission lines being connected to substrate ground via an associated varactor diode, said first and second microstrip transmission lines being electromagnetically coupled to third and fourth microstrip transmission lines and said third and fourth microstrip transmission lines being connected in series to a stripline balun comprising an output of the divider.

The invention will now be further described in conjunction with the accompanying drawings, in which.

FIGS. 1 to 5 are identical to FIGS. 4A, 5B, 6, 7 and 8 of the abovementioned Canadian Pat. No. 1,041,614 and are included here as useful background material for explaining analog microwave frequency dividers. For a thorough explanation of divide-by-two analog microwave frequency dividers, reference should be had to the aforementioned Canadian Pat. No. 1,041,614, or its U.S. counterpart.

The broad band frequency divider operates in the microwave frequency range and employs (1) stripline or microstrip transmission lines, (2) balanced varactor diodes and (3) a co-planar balun. Each of the component parts of the broad band frequency divider will be described before discussing the operation of the frequency divider itself.

This invention consists essentially of a basic resonant circuit which has two or more transmission lines; each such line being terminated with a varactor diode at one end of the line. The lines are electrically connected or electromagnetically coupled at the other end. The diodes are selected so as to be substantially matched. Means are provided for introducing a signal to the basic resonant circuit and for extracting an output signal from the circuit.

As is known, a microstrip transmission line consists of a metal conducting strip which is placed upon a dielectric substrate. The dielectric substrate often consists of alumina. On the other side of the dielectric substrate away from the conducting strip is a metal ground plane.

A stripline is basically a microstrip transmission line with an additional ground plane placed above the conducting strip which is embedded in the dielectric substrate.

Figure 1:
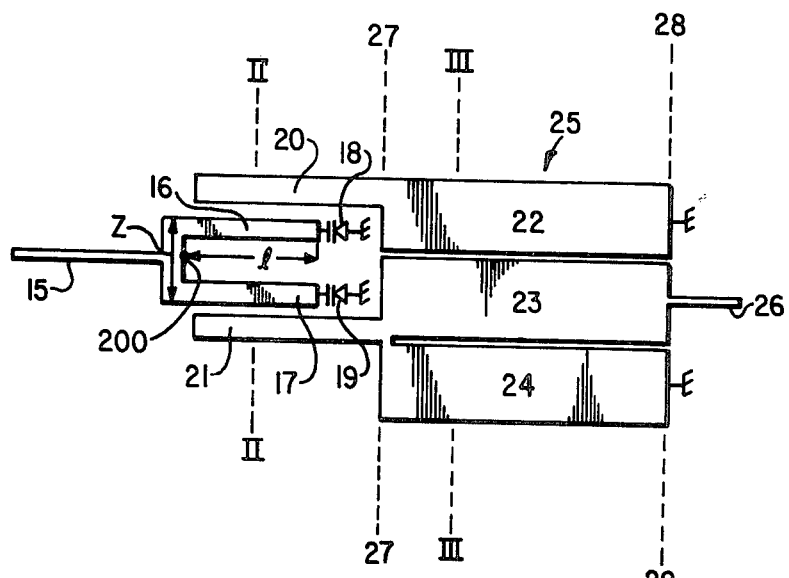
FIG. 1 is a schematic plan view of a microwave frequency divider according to the aforementioned Canadian Pat. No. 1,041,614.

A second component of the broad band frequency divider is a coplanar balun which converts a balanced input signal to an unbalanced output signal or vice versa. The co-planar balun of FIG. 1 consists of metal conductor strips 22, 23 and 24 which are placed upon a dielectric substrate (not shown). Normally, the electrical length of conductors 22, 23 and 24 will be about $\frac{1}{4}$ of the wavelength $\lambda$ of the signals to be processed. (The Greek letter $\lambda$, (lambda) indicates the wavelength of a sinusoidal signal). However, the balun has no ground plane as do microstrip or stripline transmission lines. Instead, conductors 22 and 24 are grounded at the output end as shown in FIG. 1. The co-planar balun of FIG. 1 has no metal ground plane.

Co-planar baluns have been previously described in U.S. Pat. No. 3,835,421 which was issued on Sept. 10, 1974 to DeBrecht et al. and in an article entitled "Co-Planar Balun Circuits For GaAs FET High-Power Push-Pull Amplifiers," IEEE-GMTT International Microwave Symposium, University of Colorado, June, 1973, Digest pages 309–311 by R. E. DeBrecht.

A third component part of the broad band frequency divider is the microwave varactor diode. The varactors used in the practical realizations of this invention were gallium arsenide parametric amplifier varactors manufactured by Microwave Associates Inc. of Burlington, Mass. and Alpha Industries, Inc. of Woburn, Mass. The MA-4851 series of Microwave Associates and D-5147 series made by Alpha Industries may be used, for example.

Varactor diodes are well known in the art and may be conveniently thought of as a device whose capacitance varies in a non-linear fashion with the voltage applied across its terminals.

In FIG. 1, which is a plan view of divide-by-two frequency divider, microstrip or stripline transmission line 15 carries an input electrical signal to microstrip or stripline transmission lines 16 and 17. Lines 16 and 17 are terminated with varactors 18 and 19. Line 16 extends from point 200 to varactor 18 and line 17 extends from point 200 to varactor 19. Line 15 ends at point 200. One terminal of each varactor is connected to an end of one of the transmission lines 16 and 17 and the other terminal is grounded by connection to the metallic ground plane of the microstrip or stripline transmission lines. The circuit comprising lines 16 and 17 and varactors 18 and 19 form a basic resonant circuit which supports oscillation at one-half of the frequency appearing on input line 15, if the input signal on line 15 is approximately sinusoidal and if the length of lines 16 and 17 is chosen in the manner described below. It is important to note that the critical dimension of lines 16 and 17 is "l" as shown on FIG. 1. The circuit referred to is of a broad band nature. For example, if the input signal contains frequency components ranging from 5–10 GHz and a desired output frequency range of 2.5–5 GHz were desired, then the circuit parameters would be chosen using the upper output frequency of 5 GHz as the approximate basic resonant frequency. (This is a small-signal resonance frequency). It is, of course, well known that any signal whether or not periodic may be represented by either the Fourier series or a Fourier transform. Thus, it is sufficient to examine the behavior of the device for a given sinusoidal frequency. In summary, lines 16 and 17 and varactors 18 and 19 act in combination to form a subharmonic frequency generator with a balanced output signal.

The purpose of balun 25 and coupling microstrip or stripline transmission lines 20 and 21 is to extract an output signal from the basic resonant circuit. Generally, if lines 15, 16 and 17 are microstrip lines then lines 20 and 21 will be also. Similarly, if lines 15, 16 and 17 are striplines then lines 20 and 21 may be striplines too. Hereafter, reference will be made only to microstrip lines. However, the comments apply equally to striplines and other types of lines. Open circuited microstrip transmission lines 20 and 21 are located adjacent to lines 16 and 17 of the basic resonant circuit and so a signal is induced by electromagnetic coupling into lines 20 and 21 from lines 16 and 17. The balanced signal appearing on lines 20 and 21 is conveyed to balun 25 and then to line 26 where it appears as an unbalanced output signal.

Obviously, the person skilled in the art will recognize from the foregoing discussion that the significant result is the conversion of the balanced signal of a given input frequency to an unbalanced signal of an output frequency equal to half the input frequency, and that for such purpose ordinary care should be taken in the location and dimensioning of the circuit components mentioned, so that unwanted resonance and interference effects, etc. do not arise.

As mentioned above, there is no ground plane in the balun section of FIG. 1 which lies between demarcation lines 27 and 28.

The operation and design of the circuit in FIG. 1 is now examined. Firstly, the generation of subharmonic frequencies is a result of the specific non-linear nature of the varactors 18 and 19 in the basic resonant circuit. Dr. Robert Harrison has published a general theoretical analysis of the behavior of varactors in balanced subharmonically resonant circuits in his Doctoral Thesis at the University of London, Imperial College of Science and Technology in July, 1964. The analysis of the ideal case using lumped circuit elements shows that if the input sinusoidal signal frequency to a lumped element model of the basic resonant circuit comprising lines 16 and 17 and varactors 18 and 19 is $f_{in}$ then the output will contain component signals at frequencies $f_{in}/2$, $3f_{in}/2$, $5f_{in}/2$, $7f_{in}/2$, etc. Obviously, the high frequency signals at frequencies $3f_{in}/2$, $5f_{in}2$ etc. may be readily removed by filtering. More importantly if the balance is perfect there are no even order harmonics (i.e. $f_{in}$ [$=2\times f_{in}/2$], $2f_{in}$ [$=4\times f_{in}/2$], $3f_{in}$ [$=6\times f_{in}/2$], ... ). Removal of the $f_{in}$ output frequency component is vital because in an octave-bandwidth divide-by-two device, the undesired second-harmonic of the desired output frequency at the lower edge of the band $f_{in}$ [$=2\times f_{in}/2$] will be the same frequency as the desired output frequency $f_{in}/2$ at the upper edge of the band. In such a case the undesired second harmonic $f_{in}$ [$=2\times f_{in}/2$] could not be removed by conventional filtering techniques. It should be mentioned that the inventor's analysis was theoretical and dealt with lumped circuit elements operating at much lower frequencies than are encountered here. However, the inventor's analytical technique is entirely applicable to this case.

Figure 2:
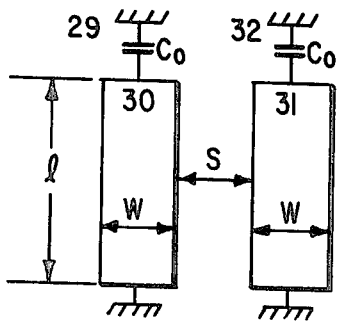
FIG. 2 is a schematic plan view of a basic resonant circuit with the varactors replaced by their average capacitance $C_0$.

The design of basic resonant circuits may be further understood by referring to FIGS. 1, 2, 3, and 4. For design purposes, the basic small-signal resonance frequency is chosen to be at or above the upper output frequency of the band in which the device is to operate. At resonance, a standing wave will appear across transmission line 16 and varactor 18 and transmission line 17 and varactor 19. At the resonance frequency the voltage at the input side of lines 16 and 17 will be 0. (i.e. a short circuit condition). If the varactors have an average capacitance of $C_o$ and if in FIG. 1 dimension Z is small compared with dimension l then the basic resonant circuit may be depicted as shown in FIG. 2. In addition, the effects of lines 20 and 21 and balun 25 of FIG. 1 on the signal on lines 16 and 17 are neglected for analytical purposes. The capacitors 29 and 32, of FIG. 2 represent the average capacitance $C_o$ of the varactors 18 and 19 of FIG. 1. Microstrip lines 30 and 31 correspond to lines 16 and 17 of FIG. 1. The lines are of electrical length $\theta$, geometrical width W and geometrical length l.

They may or may not be electromagnetically coupled to each other. The spacing between lines 30 and 31 is S. The substrate has a thickness designated by H (not shown).

An analysis of coupled microstrip transmission lines such as those shown as lines 16 and 17 of FIG. 1, and lines 30 and 31 of FIG. 2 has been performed by T. G. Bryant and J. A. Weiss in "Parameters of Microstrip Transmission Lines and of Coupled Pairs of Microstrip Lines," IEEE Transactions on Microwave Theory and Techniques, Volume MTT-16, No. 12, pages 1021–1027, December, 1968. In addition, Bryant and Weiss have published curves in an article entitled "Even and Odd Mode Characteristic Impedance for Coupled Microstrips," which appeared in Volume 1 of the Microwave Engineer's Handbook, which was printed in 1971 by Artech House of Dedham, Mass. Bryant and Weiss characterized the sinusoidal signal behaviour of coupled microstrip transmission lines by two impedances $Z_{oo}$ and $Z_{oe}$. $Z_{oe}$ is referred to as the even mode impedance and $Z_{oo}$ is the odd mode impedance. The latter reference (microwave Engineer's Handbook) has diagrams which relate the ratios of W/H and S/H to $Z_{oe}$ and $Z_{oo}$ for various values of substrate relative dielectric constant $\epsilon_r$. Thus, there are numerical data which permit $Z_{oe}$ and $Z_{oo}$ to be found if S/H and W/H are known. H is the thickness of the substrate.

Figure 3:
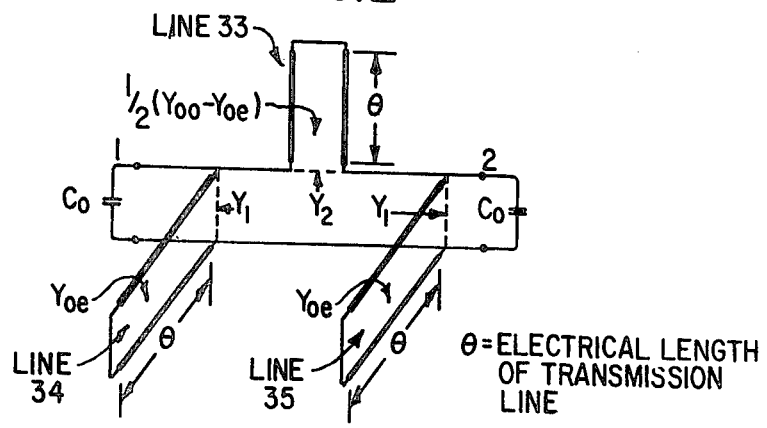
FIG. 3 is a schematic circuit diagram of the equivalent openwire circuit of a basic resonant circuit.

Using the method of Sato and Cristal published in "Simplified Analysis of Coupled Transmission LIne Networks," IEEE Transactions on Microwave Theory and Techniques, Volume MTT-18, No. 3, March., 1970, pages 122–131, an open-wire equivalent circuit for FIG. 2 can be shown to be that of FIG. 3. Transmission line 33 of the equivalent circuit has electrical length $\theta$ and a characteristic admittance of $(Y_{oo}-Y_{oe})/2$. The characteristic admittance of short-circuited lines 34 and 35 is $Y_{oe}$. $Y_2$ is the admittance seen when looking into short-circuited transmission line 33. $Y_1$ is the combined admittance of a varactor average capacitance $C_o$ and one of the short circuited lines 34 or 35 seen looking in the direction of the arrows for $Y_1$ of FIG. 3.

Thus
,
$Y_1 = j\omega C_o - jY_{oe}\cot\theta$
$Y_2 = j(\frac{1}{2})(Y_{oo}-Y_{oe})\cot\theta$ At resonance, the sum of the impedances $1/Y_1$, $1/Y_2$ and $1/Y_1$ is 0, or $Y_1 + 2Y_2 = 0$.

This gives:
$\omega C_o = Y_{oo}\cot\theta$ but $\theta$ is equal to $\omega l/v$, where l = geometrical length,
$\omega$ = angular frequency $2\pi f$, and
v = phase velocity.

Thus, for an angular resonant frequency $\omega_0 = 2\pi f_o$, the design equation for the physical length l of the transmission lines 30 and 31 of FIG. 2 is $l = (v/\omega_o) \arctan (1/\omega_o C_o Z_{oo})$.

Since $\omega_o$, v, $C_o$ and $Z_{oo}$ are known, l may be easily computed. $Z_{oo}$ is found by examining the Bryant and Weiss curves which plot $Z_{oo}$ as a function of S/H and W/H, for various values of relative substrate permittivity $\epsilon_r$. $C_o$ is approximately $C_j(V_o) + C_p$ where $V_o$ is the applied reverse bias voltage and $C_p$ is the fixed package capacitance of the varactor.

Figure 4:
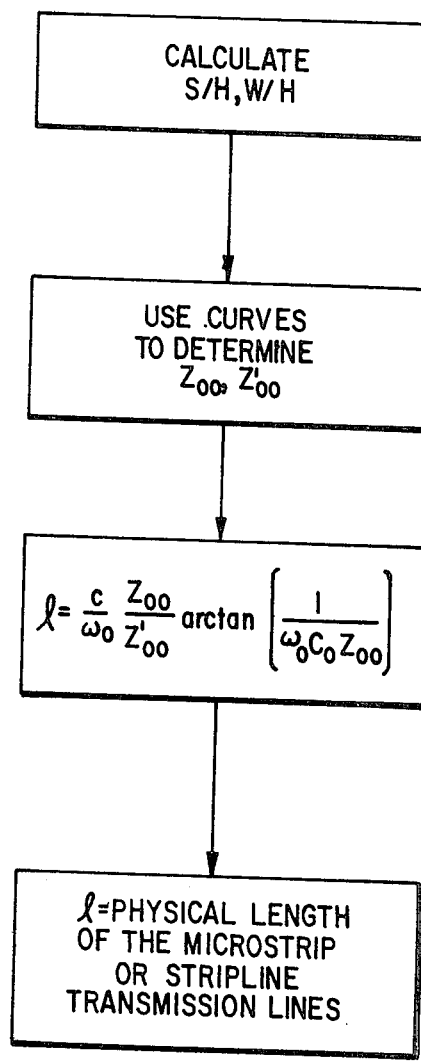
FIG. 4 is a block diagram showing the steps for the calculation of the length l of the transmission lines of the basic resonant circuit of the microwave frequency divider.

FIG. 4 is a block diagram summarizing the steps for calculating l, the geometric length of the transmission lines 30 and 31 of FIG. 2. v is computed as a fraction of the speed of light in free space c. That fraction is $Z_{oo}/Z'_{oo}$. $Z'_{oo}$ is the odd mode free space impedance of transmission lines 30 and 31 of FIG. 2. This would occur, for example, where the substrate is made of air and not alumina.

The final equation for l is
$l = (c/\omega_o \, Z_{oo}/Z'_{oo}) \arctan 1/(\omega_o C_o Z_{oo})$.

In general, l will correspond to an electrical length less than $\lambda/4$ at the resonance frequency $\omega_o$.

Having discussed the design and operation of the broad band frequency divider, a practical realization of this device including the DC bias arrangement is next considered.

Figure 5:
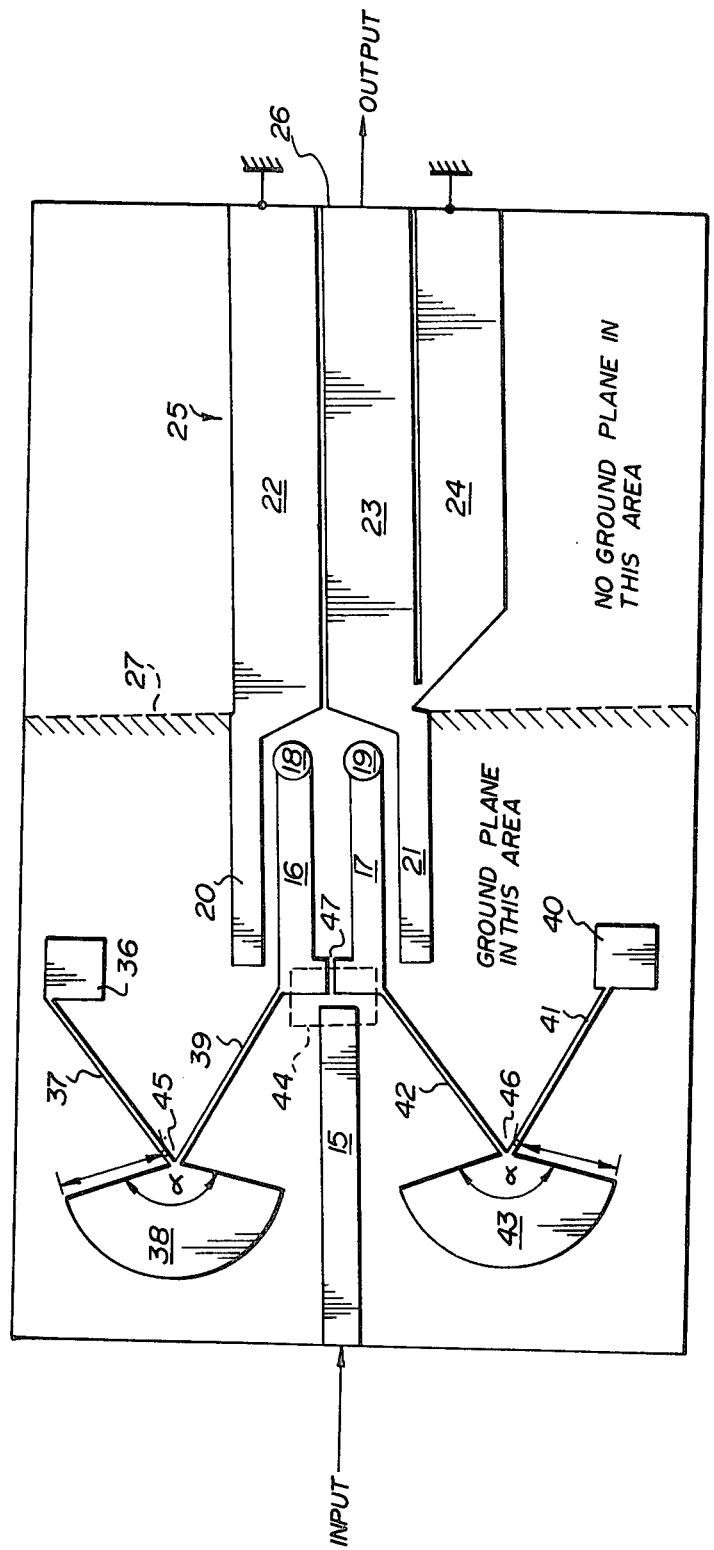
FIG. 5 is a plan view of an embodiment of a frequency divider constructed according to the aforementioned Canadian Pat. No. 1,041,614.

FIG. 5 is a plan view of the layout of a divide-by-two varactor frequency divider which was designed to accommodate an input frequency range of 8.5 to 9.5 GHz. The similarity to FIG. 1 is apparent and like numerals denote like components. DC blocking chip capacitor 44 is placed between the microstrip line 15 and lines 16 and 17. At microwave frequencies capacitor 44 is short circuit. As a variation of the basic design described here, microstrip line 15 may be used as an input matching transformer in which case its impedance will be different from 50 ohms and its length will be $\lambda/4$ at or near the centre of the input band of frequencies. Further, capacitor 44 may be chosen to partially annul the inductive part of the input impedance. The input impedance of the basic resonant circuit looks inductive because the input frequency is in general higher than the resonance frequency. Numerals 18 and 19 denote the matched pair of varactors. DC bias is applied to varactors 18 and 19 by way of pads 36 and 40 which consist of layers of conducting material placed upon the surface of the substrate layer. An individual source of DC voltage may be applied to each pad or a common source may be applied to both pads 36 and 40. In either case, one terminal of a DC source is connected to (say) pad 36 and the other terminal of the DC source is connected to the ground conductive layer. Radial transmission lines 38 and 43 at operational microwave frequencies have zero or very small input impedance at points 45 and 46. Such radial or "half-moon" lines are discussed and partially analyzed by B. A. Syrett in a Master of Engineering Thesis at Carleton University in Ottawa, Canada, January, 1973, entitled "The Use of the Automatic Network Analyzer in the Development and Modelling of a Novel Broad Band Bias Line for X-Band Microstrip Circuits." The optimum value of angle $\alpha$ is 150°. This value was not found by Syrett. The radius "r" of the "half moon" lines is approximately a quarter of a wavelength at the centre frequency of the input band of frequencies. Transmission lines 37, 39, 41 and 42 have a physical length which is also $\frac{1}{4}$ of a wavelength at the centre frequency of the input band of frequencies. So, at point 47, the impedance looking back at radial lines 38 and 43 is substantially that of an open circuit or infinity. The impedance of the bias circuit at the output frequencies is irrelevant bacause at resonance, point 47 is a virtual ground. Two biasing circuits are provided to (1) preserve the overall symmetry of the device and (2) permit independent biasing of the two varactors to optimize the balance if necessary. In case (2), two separate blocking capacitors 44 would be used, one from 15 to 16, the other from 15 to 17. The electrical length of the co-planar balun is chosen to be λ/4 at the centre of the output band of frequencies. The wavelength in the balun can be estimated from the effective dielectric constant data given by DeBrecht in the reference quoted above and is about (c/f) $2/(1+\epsilon_r)$. As shown in FIG. 5, the entire microstrip and co-planar balun circuit is intentionally skewed with respect to its substrate. This permits the input and output connectors to transmission line 15 and output point 26, being one end of arm 23 of the balun, to be mounted on the centre line of a metal enclosure box which hold the entire device. The box is milled out of solid brass and is nickel plated. There is a rectangular cavity underneath the co-planar balun part of the substrate, which operates without a ground plane. A monolithic box construction minimizes undesirable resonances at metal to metal interfaces. Its maximum transverse dimension is limited to a value corresponding to a cut-off wave guide at the maximum input frequency of interest. This helps to minimize feedthrough of the input frequency to the output side of the broad band frequency divider, namely point 26.

Note that the resonant frequency $f_o$ of the device increases as the reverse DC bias is increased. The reason for this is that the average capacitance $C_o$ reduces as the reverse voltage is increased. By rearranging the equation for 1 one gets $$f_o = (c/2\pi l\ Z_{oo}/Z'_{oo})\ \text{arctan}\ (1/\omega_o C_o Z_{oo})$$

and so $f_o$ increases as $C_o$ decreases.

The foregoing description of a "divide-by-two" divider has been provided for useful background information. Additional information is given in the aforementioned Canadian Pat. No. 1,041,614.

Figure 6:
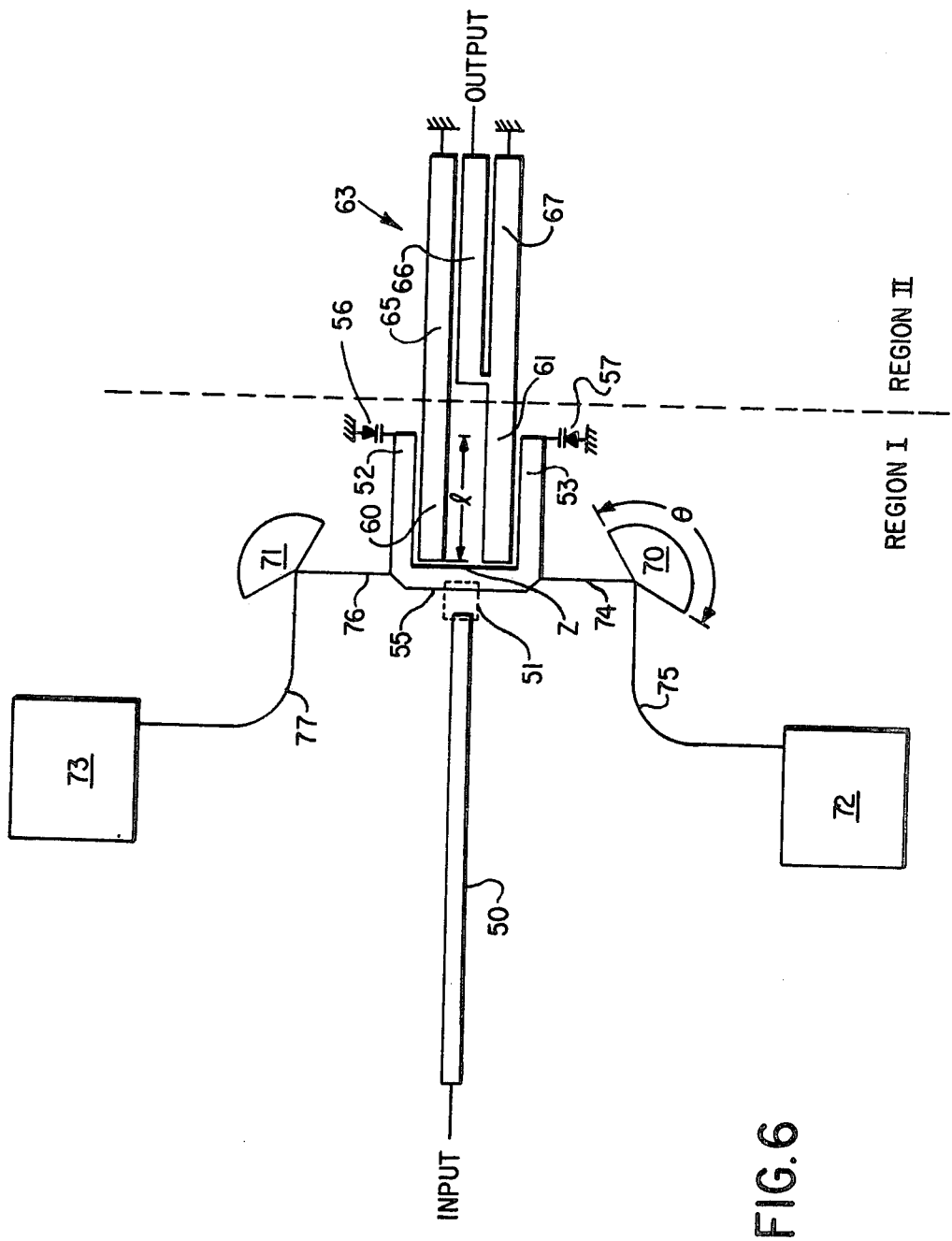
FIG. 6 is a plan view of an embodiment of a frequency divider according to the present invention.

Turning now to FIG. 6 of the drawings, there is shown a plan view of an analog microwave frequency divider according to the invention which is adapted to divide an input microwave signal by a factor of four. The divider comprises a substrate, not shown, having an input microstrip transmission line 50 capacitively coupled by a DC blocking capacitor 51 to a resonator formed of first and second spaced apart parallel microstrip transmission lines 52 and 53 of predetermined length l. One end (the left end) of each of the lines 52 and 53 is joined to the other by a transverse microstrip transmission line 55. The other end of each of the first and second microstrip transmission lines 52 and 53 is connected to substrate ground via an associated varactor diode 56 or 57. The microstrip transmission lines 52 and 53 are electromagnetically coupled to third and fourth microstrip transmission lines 60 and 61 which are, in turn, connected in series to a stripline balun, generally indicated at 63, which comprises the output of the divider. The dashed line in FIG. 6 divides the figure into two regions, region I and region II. In region I, the transmission lines are microstrip transmission lines with a ground plane whereas in region II, the lines are striplines without a ground plane. The balun 63 comprises the three lines 65, 66 and 67, lines 65 and 67 being grounded and the output being taken from line 66.

A theory of sub-harmonic dividers is given in the following reference: P. Penfield and R. Rafuse, "Varactor Applications," MIT Press (1962), p. 436–483. This reference indicates that there may be a fundamental difference between a divide-by-two device and a divide-by-four device (or more generally a divide-by-$2^k$ wherein k is greater than 1). In a divide-by-two device only two frequencies are present: the input frequency $2f_o$ and the output frequency $f_o$. In higher order dividers the theory in the aforementioned reference by Penfield and Rafuse indicates that the presence of other intermediate frequencies known as idlers may be necessary. For instance, for a divide-by-four device the input at $4f_o$ generates a sub-harmonic at $2f_o$. This sub-harmonic itself generates a sub-harmonic at $f_o$ which is taken as the output.

The physical characteristics of a divide-by-four device which has been constructed are shown in FIG. 6. Region I is constructed in microstrip configuration on an $Al_2O_3$ substrate of 0.025 inch thickness. Region II is constructed in stripline configuration on the same substrate.

Line 50 carries the input signal at frequency $4f_o$ to the resonator lines 52 and 53. The capacitor 51 serves as a DC block and as a partial impedance match for the reactive impedance of the resonator. Lines 60 and 61 extend from point Z to the varactor diodes 56 and 57. The gallium arsenide varactor diodes manufactured by Microwave Associates (MA-48501-E) are connected to lines 52 and 53 at one end and grounded to the substrate ground at the other end. The diodes provide the non-linear capacitive elements which allow energy transfer to sub-harmonic frequencies of the input. The distance l was calculated from the formula given by Harrison in "Broadband Frequency Dividers using Microwave Varactors," IEEE-MIT-S International Microwave Symposium June 21-23, 1977, Digest p.p. 80-82.

The resonant circuit is thought to be comprised of the diodes 56 and 57 and lines 52 and 53. However, if there is a resonant idler circuit present at $2f_o$ as well as the resonant circuit at $f_o$, it is not clear exactly which elements comprise the circuits. However, although the theory is not completely understood, the circuit has been found to operate satisfactorily in practice.

As mentioned above, lines 60 and 61 are used to couple the frequency $f_0$ to the output balun transformer consisting of lines 65, 66 and 67. The coupling of lines 52 and 60 and 53 and 61 has been described by T. G. Bryant and J. A. Weiss in "Parameters of Microstrip Transmission Lines and Coupled Pairs of Microstrip Lines," IEEE Trans. Microwave Theory Vol. 15, December 1968, p. 1021–1027.

The balun transformer has been described in U.S. Pat. No. 3,835,421 referred to above and also in the aforementioned article by DeBrecht. The balun transformer is used to transform the balanced signal in the resonator to an unbalanced signal for output.

The elements 70 to 77 comprise the DC bias lines for the varactor diodes 56 and 57. elements 70 and 71 are broadband short circuits. The value of angle θ is 150°. The radius is approximately one quarter wave length at the center of the input frequency band. The pads 72 and 73 are solder pads for external bias connection. Lines 74 and 76 are approximately one quarter wave length and lines 75 and 77 three quarter wave length at the center of the input frequency band.

Since the elements 70 and 71 may not act as broadband short circuits at the lower output frequency, the DC bias lines may comprise part of the resonator circuit for either the output sub-harmonic or any idler frequency that may be present.

A device constructed in accordance with FIG. 6 was used to divide microwave signals between 13 and 16 GHz down to the 3.25 to 4 GHz region. Because of poor impedance matching, especially at the input, the division was not continuous across this band. As an example of the performance of the device, an input power of approximately 16 Dbm at 15 GHz produced an output signal of approximately −5 DBm at 3.75 GHz ($f_0$). An oscillation at 7.5 GHz ($2f_0$) was also present at the output at a power of −45 Dbm. This might be construed as an idler frequency. It is expected that with proper impedance matching octave bandwidth devices could be built because of the success in this regard with the divide-by-two devices described in Canadian Pat. No. 1,041,614.

In addition, division by other numbers greater than 2 should also be possible by designing the resonant circuit consisting of elements 52, 53, 56 and 57 to resonate at the appropriate frequencies. Of specific interest is division by $2^k$ where k is an integer greater than 1.

Although the device has been described in terms of microstrip construction, it is believed that the technique could also be used with other media including wave guide, stripline and coax.

The embodiments of the invention in which an exclusive property or privilege is claimed are defined as follows:

1. A single stage analog microwave frequency divider for dividing an input microwave signal by 4, comprising a substrate having an input microstrip transmission line capacitively coupled to a resonator formed of first and second spaced apart parallel microstrip transmission lines of predetermined length, one end of each of said first and second microstrip lines being joined together by a transverse microstrip transmission line and the other end of each of said first and second microstrip transmission lines being connected to substrate ground via an associated varactor diode, said resonator generating an output signal having a frequency one-fourth that of an input signal applied to said input microstrip transmission line, said first and second microstrip transmission lines being electromagnetically coupled to third and fourth microstrip transmission lines and said third and fourth microstrip transmission lines being connected in series to a stripline balun and supplying said resonator output signal to said balun, said balun comprising an output of the divider.

2. A frequency divider as claimed in claim 1 further comprising means for applying a DC bias to each of said varactor diodes.

3. A frequency divider as claimed in claim 2 wherein said first and second microstrip transmission lines are of equal length.

4. A frequency divider as claimed in claim 1, 2 or 3 wherein said third and fourth microstrip transmission lines are disposed between said first and second microstrip transmission lines.

* * * * *